(12) United States Patent
Ho et al.

(10) Patent No.: US 11,056,435 B2
(45) Date of Patent: Jul. 6, 2021

(54) SEMICONDUCTOR PACKAGE WITH CHAMFERED PADS

(71) Applicant: Advanced Semiconductor Engineering, Inc., Kaohsiung (TW)

(72) Inventors: Cheng-Lin Ho, Kaohsiung (TW); Chung Chieh Chang, Kaohsiung (TW); Ya Fang Chan, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 425 days.

(21) Appl. No.: 15/815,351

(22) Filed: Nov. 16, 2017

(65) Prior Publication Data
US 2019/0148297 A1    May 16, 2019

(51) Int. Cl.
*H01L 23/535* (2006.01)
*H01L 21/02* (2006.01)
(Continued)

(52) U.S. Cl.
CPC ...... *H01L 23/535* (2013.01); *H01L 21/02019* (2013.01); *H01L 23/49838* (2013.01);
(Continued)

(58) Field of Classification Search
CPC ............. H01L 23/535; H01L 21/02019; H01L 2224/29026
See application file for complete search history.

(56) References Cited

U.S. PATENT DOCUMENTS 7,064,450 B1 *  6/2006  Eghan ............... H01L 22/32
                                                      257/48
8,184,444 B2     5/2012  Lee et al.
(Continued)

FOREIGN PATENT DOCUMENTS

CN      203368919 U  * 12/2013

OTHER PUBLICATIONS

FIG 01 fromQMaxTest.com (Sep. 15, 2015) https://www.google.com/search?tbm=isch&q=plcc+package&chips=q:ceramic+ic+package,g_2:soic&sa=X&ved=0ahUKEwimhvvzt-jbAhUJ5IMKHeViAKwQ4IYIKSgB&biw=1920&bih=1031&dpr=1#imgrc=4lirUS3ZtorTWM.*
(Continued)

*Primary Examiner* — Peter Bradford
(74) *Attorney, Agent, or Firm* — Foley & Lardner LLP

(57) ABSTRACT

At least some embodiments of the present disclosure relate to a substrate for packaging a semiconductor device package. The substrate comprises a dielectric layer, a first conductive element adjacent to the dielectric layer, a second conductive element adjacent to the dielectric layer, and a third conductive element adjacent to the dielectric layer. The first conductive element has a first central axis in a first direction and a second central axis in a second direction. The first conductive element comprises a first chamfer and a second chamfer adjacent to the first chamfer. The second conductive element has a first central axis in the first direction and a second central axis in the second direction. The third conductive element has a first central axis in the first direction and a second central axis in the second direction. The first central axes of the first, second, and third conductive elements are substantially parallel to one another in the first direction and are misaligned from one another. The second central axes of the first and second conductive
(Continued)

elements are substantially co-linear in the second direction. The second central axis of the third conductive element is substantially parallel to and misaligned from the second central axes of the first and second conductive elements. The first chamfer and the second chamfer are separated by at least one of the first central axis and the second central axis of the first conductive element and are substantially asymmetric.

25 Claims, 8 Drawing Sheets

(51) Int. Cl.
  *H01L 23/498* (2006.01)
  *H01L 23/00* (2006.01)
(52) U.S. Cl.
  CPC .............. *H01L 24/13* (2013.01); *H01L 24/16* (2013.01); *H01L 2224/13082* (2013.01); *H01L 2224/16238* (2013.01); *H01L 2224/29026* (2013.01); *H01L 2224/73204* (2013.01); *H01L 2224/81191* (2013.01); *H01L 2224/81385* (2013.01)

(56) References Cited

U.S. PATENT DOCUMENTS

| 2011/0049725 | A1* | 3/2011 | Topacio | H01L 24/05 257/773 |
| 2011/0108981 | A1* | 5/2011 | Rahim | H01L 23/3171 257/737 |
| 2012/0286397 | A1* | 11/2012 | Kuechenmeister | H01L 23/585 257/620 |
| 2013/0025927 | A1* | 1/2013 | Andresen | H05K 1/114 174/266 |
| 2015/0162298 | A1* | 6/2015 | Groenhuis | H01L 23/4951 257/773 |
| 2017/0338175 | A1* | 11/2017 | Liu | H01L 24/19 |

OTHER PUBLICATIONS

FIG 02 fromWire Bonded BGA https://www.google.com/search?q=bga+package&hl=en&source=lnms&tbm=isch&sa=X&ved=0ahUKEwjmrlHm0-jbAhUR24MKHbWVAYsQ_AUICigB&biw=1920&bih=1031#imgrc=AiypF4PWYaxlQM:.*

* cited by examiner

SEMICONDUCTOR PACKAGE WITH CHAMFERED PADS

BACKGROUND

1. Technical Field

The present disclosure relates to a substrate for packaging a semiconductor device package, and a substrate for which vertical central axes of first, second, and third conductive elements of the substrate are parallel to one another and not co-linear with one another and a first chamfer and a second chamfer of the first conductive element are asymmetric.

2. Description of the Related Art

To improve performance of a semiconductor device package, more conductive pads can be disposed on a substrate (for packaging a semiconductor device) to provide more inputs/outputs (I/Os). Moreover, conductive traces may be designed to bypass two adjacent conductive pads. In a trend of miniaturization, a width/pitch of the conductive pads/traces is scaled down, which may cause bridging issues or circuit short issues when disposing the semiconductor device on the substrate via solder resist (e.g. the resist between the bonding pad of the semiconductor device and the conductive pad of the substrate may flow or bleed to the conductive traces or other conductive pads). A protection layer which covers the conductive traces and a portion of the conductive pads can be used to address the aforesaid issue. Moreover, a conductive post/bump/pillar can be formed on the exposed conductive pad (e.g. via the protection layer) for connection. However, design specifications corresponding to height (co-planarity) and cross-sectional area of the conductive post/bump/pillar may be strict to ensure a secure connection, and may be challenging to implement.

SUMMARY

In some embodiments, according to one aspect, a substrate for packaging a semiconductor device package includes a dielectric layer, a first conductive element adjacent to the dielectric layer, a second conductive element adjacent to the dielectric layer, and a third conductive element adjacent to the dielectric layer. The first conductive element has a first central axis in a first direction and a second central axis in a second direction. The first conductive element includes a first chamfer and a second chamfer adjacent to the first chamfer. The second conductive element has a first central axis in the first direction and a second central axis in the second direction. The third conductive element has a first central axis in the first direction and a second central axis in the second direction. The first central axes of the first, second, and third conductive elements are substantially parallel to one another and are misaligned from one another. The second central axes of the first and second conductive elements are substantially co-linear. The second central axis of the third conductive element is substantially parallel to and misaligned from the second central axes of the first and second conductive elements. The first chamfer and the second chamfer are substantially asymmetric.

In some embodiments, according to another aspect, a substrate for packaging a semiconductor device package includes a dielectric layer, a first conductive element adjacent to the dielectric layer, a second conductive element adjacent to the dielectric layer, and a third conductive element adjacent to the dielectric layer. The first conductive element has a first central axis in a first direction and a second central axis in a second direction. The first conductive element includes a first chamfer and a second chamfer adjacent to the first chamfer. The second conductive element has a first central axis in the first direction and a second central axis in the second direction. The second conductive element includes a first chamfer. The third conductive element has a first central axis in the first direction and a second central axis in the second direction. The third conductive element includes a first chamfer. The first chamfer of the first conductive element is adjacent to the first chamfer of the second conductive element and the second chamfer of the first conductive element is adjacent to the first chamfer of the third conductive element.

In some embodiments, according to another aspect, a semiconductor device package includes a substrate and a semiconductor device. The substrate includes a dielectric layer, a first conductive element adjacent to the dielectric layer, a second conductive element adjacent to the dielectric layer, and a third conductive element adjacent to the dielectric layer. The first conductive element has a first central axis in a first direction and a second central axis in a second direction. The first conductive element includes a first chamfer and a second chamfer adjacent to the first chamfer. The second conductive element has a first central axis in the first direction and a second central axis in the second direction. The third conductive element has a first central axis in the first direction and a second central axis in the second direction. The first central axes of the first, second, and third conductive elements are substantially parallel to one another and are misaligned from one another. The second central axes of the first and second conductive elements are substantially co-linear. The second central axis of the third conductive element is substantially parallel to and misaligned from the second central axes of the first and second conductive elements. The first chamfer and the second chamfer are substantially asymmetric. The semiconductor device has an active surface facing the dielectric layer. The semiconductor device is disposed on the substrate and is electrically connected to the first, second, and third conductive elements.

In some embodiments, according to another aspect, a method is disclosed for manufacturing a substrate. The method includes: providing a dielectric layer and a circuit layer adjacent to a surface of the dielectric layer; forming a conductive layer on the circuit layer; providing a patterned photoresist on the conductive layer, the patterned photoresist including a first patterned photoresist, a second patterned photoresist, and a third patterned photoresist, the first patterned photoresist having a first central axis in a first direction and a second central axis in a second direction, the first patterned photoresist including a first chamfer and a second chamfer adjacent to the first chamfer, the second patterned photoresist having a first central axis in the first direction and a second central axis in the second direction, the third patterned photoresist having a first central axis in the first direction and a second central axis in the second direction, wherein, the first central axes of the first, second, and third patterned photoresists are substantially parallel to one another and are misaligned from one another, wherein the second central axes of the second and third patterned photoresists are substantially co-linear, the second central axis of the third patterned photoresist is parallel to and misaligned from the second central axes of the first and second patterned photoresists, and wherein the first chamfer and the second chamfer are substantially asymmetric; and etching the conductive layer to form a plurality of conductive elements, at least one of the plurality of conductive elements having two asymmetric chamfers.

In some embodiments, according to another aspect, a substrate for packaging a semiconductor device package includes a dielectric layer, a first conductive element adjacent to the dielectric layer, a second conductive element adjacent to the dielectric layer, and a third conductive element adjacent to the dielectric layer. The first conductive element has a first central axis in a first direction and a second central axis in a second direction. The first conductive element has a first side surface and a second side surface adjacent to the first side surface. The second conductive element has a first central axis in the first direction and a second central axis in the second direction. The third conductive element has a first central axis in the first direction and a second central axis in the second direction. The first central axes of the first, second, and third conductive elements are substantially parallel to one another and are misaligned from one another. The second central axes of the first and second conductive elements are substantially co-linear. The second central axis of the third conductive element is substantially parallel to and misaligned from the second central axes of the first and second conductive elements. The first side surface and a second side surface are substantially asymmetric.

In some embodiments, according to another aspect, a substrate for packaging a semiconductor device package includes a dielectric layer, a first conductive element adjacent to the dielectric layer, a second conductive element adjacent to the dielectric layer, and a third conductive element adjacent to the dielectric layer. The first conductive element has a first central axis in a first direction and a second central axis in a second direction. The first conductive element has a first side surface and a second side surface adjacent to the first side surface. The second conductive element has a first central axis in the first direction and a second central axis in the second direction. The second conductive element has a first side surface. The third conductive element has a first central axis in the first direction and a second central axis in the second direction. The third conductive element has a first side surface. The first side surface of the first conductive element is adjacent to the first side surface of the second conductive element and the second side surface of the first conductive element is adjacent to the first side surface of the third conductive element.

DETAILED DESCRIPTION

Figure 1:
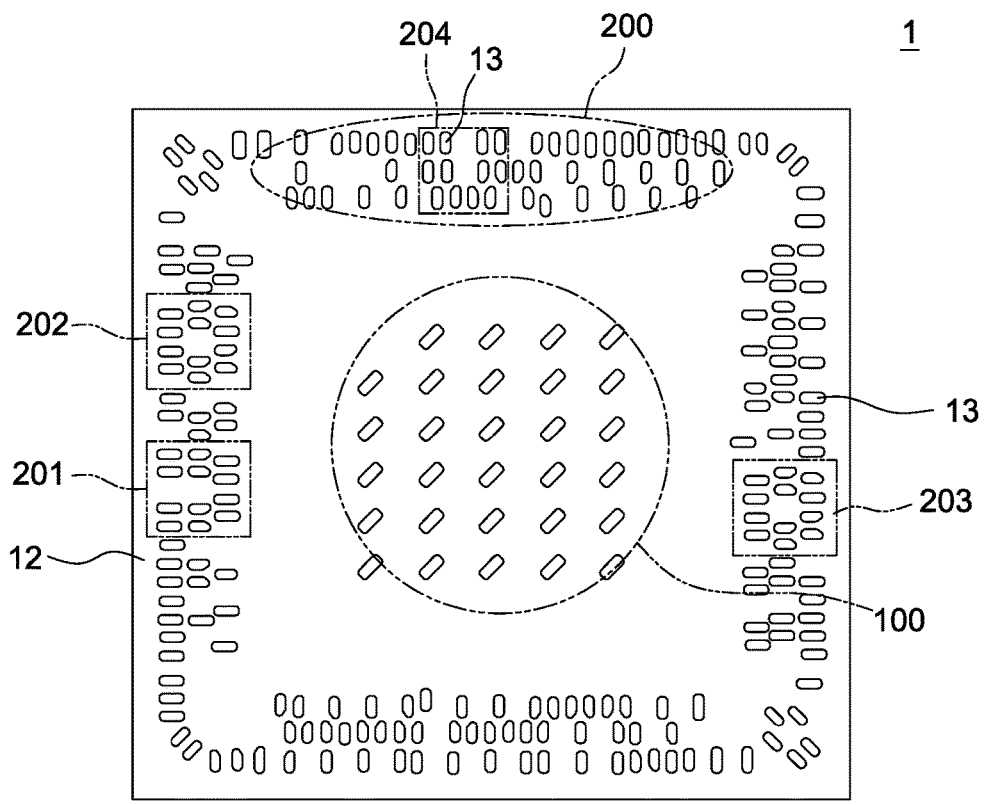
FIG. 1 illustrates a layout of conductive elements in or on a substrate in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a layout of conductive elements in, or on, a substrate 1 in accordance with some embodiments of the present disclosure. The substrate 1 includes a protection layer 12 and a patterned conductive layer 13.

The patterned conductive layer 13 includes a plurality of conductive elements on the protection layer 12. A region where an average distance or an average pitch between one conductive element and an adjacent, nearest-neighbor conductive element is equal to or greater than approximately 100 micrometers (μm) (such as, for example, equal to or greater than approximately 110 μm equal to or greater than approximately 120 μm equal to or greater than approximately 130 μm equal to or greater than approximately 140 μm or equal to or greater than approximately 150 μm) can be referred to as "sparse". A region where an average distance or an average pitch between one conductive element and an adjacent, nearest-neighbor conductive element is equal to or less than approximately 50 μm (such as, for example, equal to or less than approximately 45 μm, equal to or less than approximately 40 μm, or equal to or less than approximately 35 μm) can be referred to as "dense."

The substrate 1 includes a region 100 that is sparse and a region 200 that is dense. The region 200 further includes a region 201, a region 202, and a region 203. The distance or pitch between any two adjacent, nearest-neighbor conductive elements in the region 100 is equal to or greater than approximately 100 μm. The distance or pitch between any two adjacent, nearest-neighbor conductive elements in the region 201 is equal to or less than approximately 50 μm. In one or more embodiments, the distance or pitch between any two adjacent, nearest-neighbor conductive elements in the region 202 is equal to or less than approximately 50 μm. In one or more embodiments, the distance or pitch between any two adjacent, nearest-neighbor conductive elements in the region 203 is equal to or less than approximately 50 μm.

Formation of the conductive elements of the patterned conductive layer 13 can be controlled by etching operations. During the etching operations, etching rates may be different for different regions of the substrate 1 because of different surface densities of the conductive elements in the different regions. When conductive elements are densely arranged, such as the distance or pitch between any two adjacent conductive elements being equal to or less than approximately 50 μm, the etching rate would be relative slow for the conductive elements during the etching operations. When conductive elements are sparsely arranged, such as the distance or pitch between any two adjacent conductive elements being equal to or greater than approximately 100 μm, the etching rate would be relative fast for the conductive elements during the etching operations. Thus, the sizes of the plurality of conductive elements of the patterned conductive layer 13 at different positions of the regions may be different due to the different surface densities of the arrangements of the conductive elements.

Figure 2:
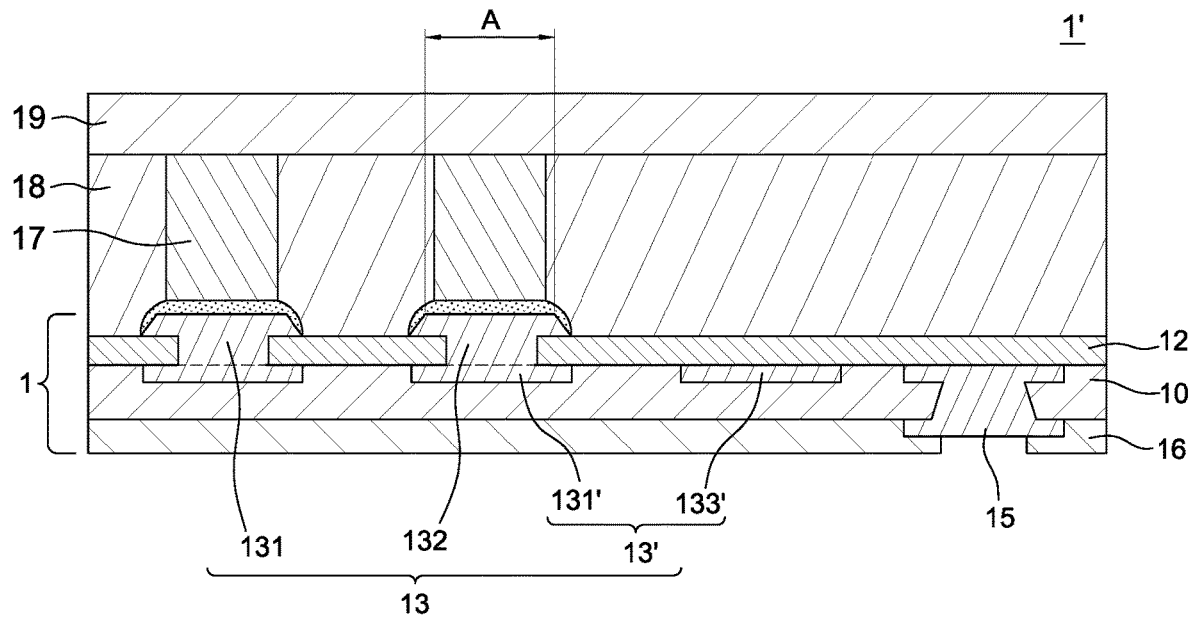
FIG. 2 illustrates a cross-sectional view of a semiconductor device package according to some embodiments of the present disclosure.

FIG. 2 is a cross-sectional view of a semiconductor device package 1' in accordance with some embodiments of the present disclosure. The semiconductor device package 1' includes a substrate 1, a conductive post 17, an encapsulant 18, and a semiconductor device 19. The substrate 1 includes a dielectric layer 10, a protection layer 12, a protection layer 16, a patterned conductive layer 13, and a patterned conductive layer 15.

The patterned conductive layer 13 is adjacent to a top surface of the dielectric layer 10. The patterned conductive layer 13 includes a circuit layer 13', a conductive element 131, and a conductive element 132. The circuit layer 13' includes a conductive pad 131' and a conductive trace 133' adjacent to the conductive pad 131'. The conductive element 131 may be disposed on the conductive pad 131' or the conductive trace 133'. The conductive element 132 may be disposed on the conductive pad 131' or the conductive trace 133'. The conductive element 131 or the conductive element 132 may be an external conductive element for external connection. The conductive element 131 has a top surface area A. The conductive element 132 has a top surface area A. The top surface area A of the conductive element 131 is substantially the same as the top surface area A of the conductive element 132. In some embodiments, a size (e.g. one or more of a height, a length, a width, a volume, or other size characteristics) of the conductive element 131 is substantially the same as the size of the conductive element 132.

The conductive element 131 has a first portion embedded in the protection layer 12 and a second portion protruding from the protection layer 12. A width of a bottom surface of the second portion of the conductive element 131 is greater than a width of a top surface of the second portion of the conductive element 131. The second portion of the conductive element 131 tapers from the bottom of the second portion of the conductive element 131 toward the top of the second portion of the conductive element 131. The width of the bottom surface of the second portion of the conductive element 131 is greater than a maximum width of the first portion of the conductive element 131. The structure of the conductive element 132 is substantially the same as the structure of the conductive element 131.

The protection layer 12 is disposed on the top surface of the dielectric layer 10. The protection layer 12 surrounds the first conductive element 131 and the second conductive element 132. The protection layer 12 surrounds the first portion of the conductive element 131 and the first portion of the conductive element 132. The protection layer 12 may include a solder resist, a development dielectric material, or other suitable materials.

The patterned conductive layer 15 is adjacent to a bottom surface of the dielectric layer 10. The patterned conductive layer 15 is disposed on the bottom surface of the dielectric layer 10. The patterned conductive layer 15 is partially covered by the protection layer 16. The patterned conductive layer 15 is electrically connected to the patterned conductive layer 13 through an interconnection element. The protection layer 16 may include a solder resist, a development dielectric material, or other suitable materials. A material of the protection layer 16 may be the same as or different from a material of the protection layer 12.

The semiconductor device 19 is attached to the substrate 1. The semiconductor device 19 is electrically connected to the substrate 1 through one or more conductive posts 17. The semiconductor device 19 may include an application-specific integrated circuit (ASIC), a controller, a processor or other electronic component or semiconductor device. The semiconductor device 19 has an active surface facing the dielectric layer 10. The conductive posts 17 are respectively electrically connected to the conductive elements 131 and 132 via a solder material. The solder material may include tin (Sn). The encapsulant 18 is disposed between the substrate 1 and the semiconductor device 19. Since the conductive element 131 and the conductive element 132 have a substantially same top area, the electrical connection between the patterned conductive layer 13 and the semiconductor device 19 can be made stable and a yield of the semiconductor device package 1' can be made stable.

Figure 3A:
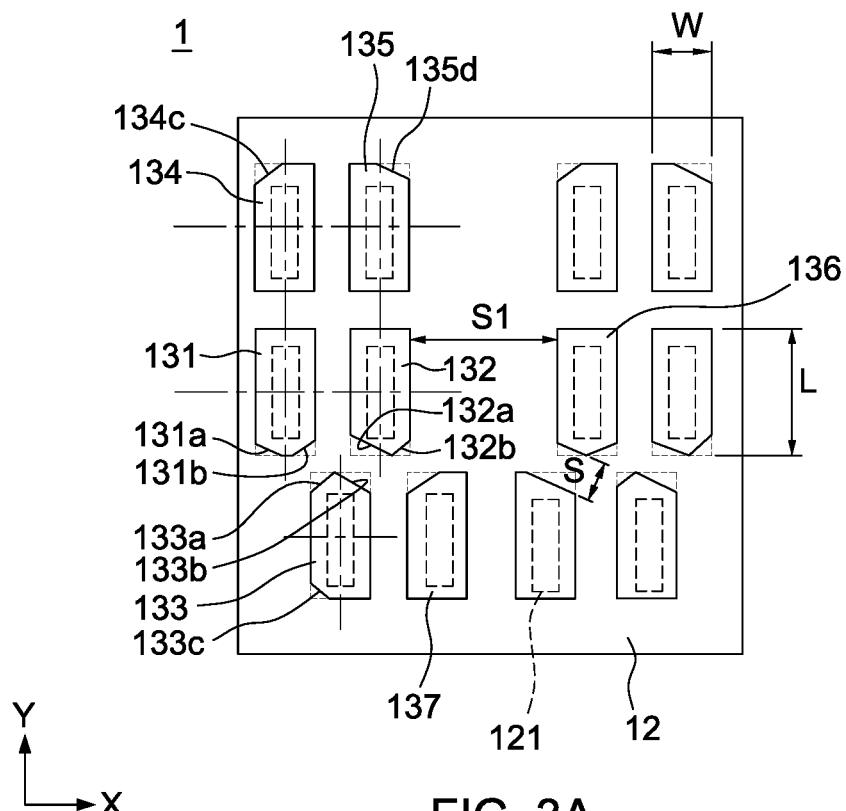
FIG. 3A illustrates a layout of conductive elements on a substrate according to some embodiments of the present disclosure.

FIG. 3A is a layout of conductive elements on the substrate 1 according to some embodiments of the present disclosure. The patterned conductive layer 13 includes conductive elements 131, 132, 133, 134, 135, and 136. In some embodiments, the conductive elements may be disposed in the region 201 as shown in FIG. 1 (or in another dense region). In some embodiments, the conductive elements may be arranged in a pattern or layout similar to or the same as the layout as shown in the region 201 of FIG. 1. The conductive elements may be arranged in a pattern or layout similar to or the same as the layout as shown in the region 202 of FIG. 1. The conductive elements may be arranged in a pattern or layout similar to or the same as the layout as shown in the region 203 of FIG. 1.

The conductive elements 131, 132, 133, 134, 135, 136, and 137 may have a substantially same length L, a substantially same width W and a substantially same height. The conductive elements 131, 132, 133, 134, 135, 136, 137 may have substantially the same maximum length L. The conductive elements 131, 132, 133, 134, 135, 136, 137 may have substantially the same maximum width W. The conductive elements 131, 132, 133, 134, 135, 136, 137 may have a substantially same top surface area. The length L may be ranged from approximately 55 μm to approximately 75 μm. The width W may be ranged from approximately 15 μm to approximately 35 μm. An average distance S between any two adjacent, nearest-neighbor conductive elements 131, 132, 133, 134, 135, 136, and 137 may be ranged from approximately 25 μm to approximately 35 μm. An average pitch (not denoted in FIG. 3A) between any two adjacent, nearest-neighbor conductive elements 131, 132, 133, 134, 135, 136, and 137 may be ranged from approximately 25 μm to approximately 35 μm. Conductive elements 131, 132, and 136 may be disposed in a same row, and the conductive element 136 may be disposed further from the conductive element 132 than is the conductive element 131. A distance S1 between conductive elements 132, 136 may be ranged from approximately 50 μm to approximately 100 μm.

The conductive element 131 has a central axis in a Y direction (length direction) and a central axis in an X direction (width direction) orthogonal or perpendicular to the Y direction. The conductive element 131 includes a chamfer (or chamfered side surface) 131a and a chamfer (or chamfered side surface) 131b adjacent to the chamfer 131a. The shape of the conductive element 131 may be an irregular hexagon. The shape of the conductive element 131 may be a polygon. The shape of the conductive element 131 may be an irregular polygon. The conductive element 132 has a central axis in the Y direction and a central axis in the X direction. The conductive element 132 includes a chamfer 132a and a chamfer 132b adjacent to the chamfer 132a. The shape of the conductive element 132 may be an irregular pentagon. The shape of the conductive element 132 may be a polygon. The shape of the conductive element 132 may be an irregular polygon. The conductive element 133 has a central axis in the Y direction and a central axis in the X direction. The conductive element 133 includes a chamfer 133a, a chamfer 133b adjacent to the chamfer 133a, and a chamfer 133c opposite to the chamfer 133b. The shape of the conductive element 133 may be an irregular hexagon. The shape of the conductive element 133 may be a polygon. The shape of the conductive element 133 may be an irregular polygon. The conductive element 134 has a central axis in the Y direction and a central axis in the X direction. The conductive element 134 includes a chamfer 134c. The shape of the conductive element 134 may be an irregular pentagon. The shape of the conductive element 134 may be a polygon. The shape of the conductive element 134 may be an irregular polygon. The conductive element 135 has a central axis in the Y direction and a central axis in the X direction. The conductive element 135 includes a chamfer 135d. The shape of the conductive element 135 may be an irregular pentagon. The shape of the conductive element 135 may be a polygon. The shape of the conductive element 135 may be an irregular polygon. In some embodiments, a chamfer may refer to a transitional edge or surface between two faces of a component (e.g. for a photoresist island/block (a body including a photoresist material) or a conductive element), and forms an angle different from 90 degrees (e.g., greater than 90 degrees) with respect to at least one, or each, of the two faces. In some embodiments, each of the conductive elements 131, 132, 133, 134, 135, 136, and 137 may include 1, 2, or 3 chamfers.

The central axes of the conductive elements 131, 132, 133 in the Y direction are substantially parallel to one another and are misaligned from one another in the Y direction (are not co-linear with one another). The central axes of the conductive elements 131, 134 in the Y direction are substantially co-linear. The central axes of the conductive elements 132, 135 in the Y direction are substantially co-linear in the Y direction. The central axes of the conductive elements 134, 135 in the X direction are substantially co-linear in the X direction. The central axes of the conductive elements 131, 132 in the X direction are substantially co-linear in the X direction. The central axis of the conductive element 133 in the X direction is substantially parallel to and misaligned from the central axes of the conductive elements 131, 132 in the X direction. The chamfer 131a and the chamfer 131b of the conductive element 131 are substantially asymmetric. The chamfer 131a and the chamfer 131b of the conductive element 131 are substantially asymmetric with respect to the central axis that separates them. The chamfer 132a and the chamfer 132b of the conductive element 132 are substantially asymmetric. The chamfer 132a and the chamfer 132b of the conductive element 132 are substantially asymmetric with respect to the central axis that separates them. The chamfer 133a and the chamfer 133b of the conductive element 133 are substantially asymmetric. The chamfer 133a and the chamfer 133b of the conductive element 133 are substantially asymmetric with respect to the central axis that separates them. The chamfer 133a of the conductive element 133 is adjacent to, or faces, the chamfer 131b of the conductive element 131. The chamfer 133b of the conductive element 133 is adjacent, or faces, to the chamfer 132a of the conductive element 132.

Figure 3B:
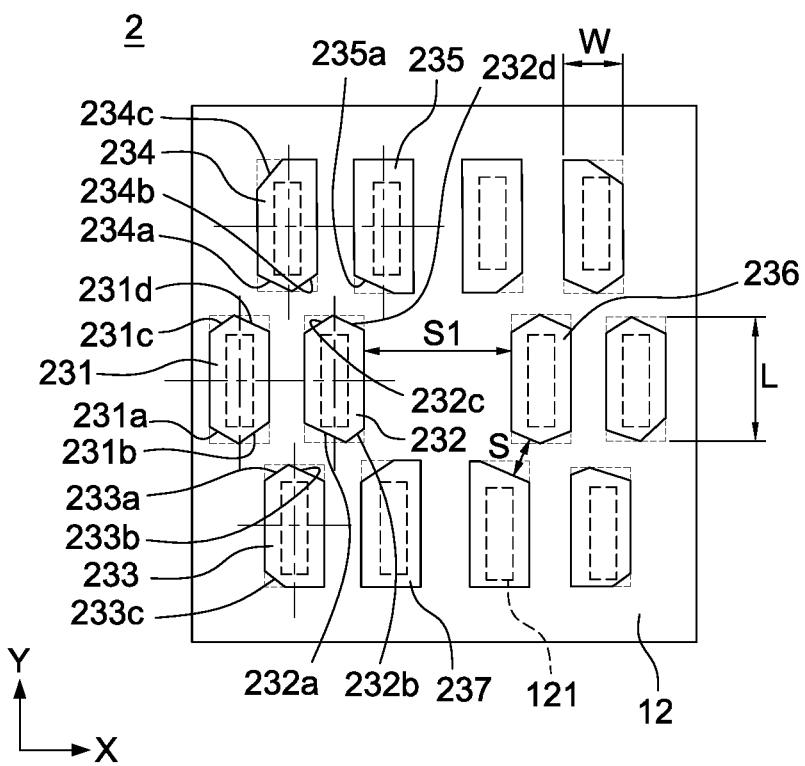
FIG. 3B illustrates a layout of conductive elements on a substrate according to some embodiments of the present disclosure.

FIG. 3B is a layout of conductive elements on a substrate 2 according to some embodiments of the present disclosure. The structure of the substrate 2 is similar to the structure of the substrate 1. The substrate 2 includes a dielectric layer 10, a protection layer 12, a protection layer 16, a patterned conductive layer 13, and a patterned conductive layer 15. The patterned conductive layer 13 includes the circuit layer 13' and conductive elements 231, 232, 233, 234, 235, 236, 237. In some embodiments, the conductive elements may be arranged in a pattern or layout similar to or the same as the layout as shown in the region 202 of FIG. 1. The conductive elements may be arranged in a pattern or layout similar to or the same as the layout as shown in the region 201 of FIG. 1. The conductive elements may be arranged in a pattern or layout similar to or the same as the layout as shown in the region 203 of FIG. 1.

The conductive elements 231, 232, 233, 234, 235, 236, 237 may have substantially the same length L, width W and height. The conductive elements 231, 232, 233, 234, 235, 236, 237 may have substantially the same maximum length L. The conductive elements 231, 232, 233, 234, 235, 236, 237 may have substantially the same maximum width W. The conductive elements 231, 232, 233, 234, 235, 236, 237 may have substantially the same top surface area. The length L may be ranged from approximately 55 μm to approximately 75 μm. The width W may be ranged from approximately 15 μm to approximately 35 μm. An average distance S between any two adjacent, nearest-neighbor conductive elements may be ranged from approximately 25 μm to approximately 35 μm. An average pitch between any two adjacent, nearest-neighbor conductive elements may be ranged from approximately 25 μm to approximately 35 μm. A distance S1 between conductive elements 232, 236 may be ranged from approximately 50 μm to approximately 100 μm.

The conductive element 231 has a central axis in the Y direction and a central axis in the X direction. The conductive element 231 includes a chamfer 231a, a chamfer 231b adjacent to the chamfer 231a, a chamfer 231c opposite to the chamfer 231b, and a chamfer 231d opposite to the chamfer 231a. The chamfer 231c is adjacent to the chamfer 231d. The shape of the conductive element 231 may be an irregular hexagon. The shape of the conductive element 231 may be a polygon. The shape of the conductive element 231 may be an irregular polygon. The conductive element 232 has a central axis in the Y direction and a central axis in the X direction. The conductive element 232 includes a chamfer 232a, a chamfer 232b adjacent to the chamfer 232a, a chamfer 232c opposite to the chamfer 232b, and a chamfer 232d opposite to the chamfer 232a. The chamfer 232c is adjacent to the chamfer 232d. The shape of the conductive element 232 may be an irregular hexagon. The shape of the conductive element 232 may be a polygon. The shape of the conductive element 232 may be an irregular polygon. The conductive element 233 has a central axis in the Y direction and a central axis in the X direction. The conductive element 233 includes a chamfer 233a, a chamfer 233b adjacent to the chamfer 233a, and a chamfer 233c opposite to the chamfer 233b. The shape of the conductive element 233 may be an irregular hexagon. The shape of the conductive element 233 may be a polygon. The shape of the conductive element 233 may be an irregular polygon. The conductive element 234 has a central axis in the Y direction and a central axis in the X direction. The conductive element 234 includes a chamfer 234a, a chamfer 234b adjacent to the chamfer 234a, and a chamfer 234c opposite to the chamfer 234b. The shape of the conductive element 234 may be an irregular hexagon. The shape of the conductive element 234 may be a polygon. The shape of the conductive element 234 may be an irregular polygon. The conductive element 235 has a central axis in the Y direction and a central axis in the X direction. The conductive element 235 includes a chamfer 235a. The shape of the conductive element 235 may be an irregular pentagon. The shape of the conductive element 235 may be a polygon. The shape of the conductive element 235 may be an irregular polygon. In some embodiments, a chamfer may refer to a transitional edge or surface between two faces of a component (e.g. a photoresist island/block or a conductive element). In some embodiments, each of the conductive elements 231, 232, 233, 234, 235, 236, 237 may include 1, 3, or 4 chamfers.

The central axes of the conductive elements 231, 232, 233 in the Y direction are substantially parallel to one another and are misaligned from one another in the Y direction. The central axes of the conductive elements 231, 232 in the X direction are substantially co-linear. The central axis of the conductive element 233 in the X direction is substantially parallel to and misaligned from the central axes of the conductive elements 231, 232 in the X direction. The chamfer 231a and the chamfer 231b of the conductive element 231 are substantially asymmetric. The chamfer 231a and the chamfer 231b of the conductive element 231 are substantially asymmetric with respect to the central axis that separates them. The chamfer 231c and the chamfer 231d of the conductive element 231 are substantially asymmetric with respect to the central axis that separates them. The chamfer 232a and the chamfer 232b of the conductive element 232 are substantially asymmetric. The chamfer 232a and the chamfer 232b of the conductive element 232 are substantially asymmetric with respect to the central axis that separates them. The chamfer 232c and the chamfer 232d of the conductive element 232 are substantially asymmetric with respect to the central axis that separates them. The chamfer 233a and the chamfer 233b of the conductive element 233 are substantially asymmetric. The chamfer 233a and the chamfer 233b of the conductive element 233 are substantially asymmetric with respect to the central axis that separates them. The chamfer 233a of the conductive element 233 is adjacent to, or faces, the chamfer 231b of the conductive element 231. The chamfer 233b of the conductive element 233 is adjacent to, or faces, the chamfer 232a of the conductive element 232.

The central axes of the conductive elements 232, 234, 235 in the Y direction are substantially parallel to one another and are misaligned from one another in the Y direction. The central axes of the conductive elements 234, 235 in the X direction are substantially co-linear. The central axis of the conductive element 232 in the X direction is substantially parallel to and misaligned from the central axes of the conductive elements 234, 235 in the X direction. The chamfer 234a and the chamfer 234b of the conductive element 234 are substantially asymmetric. The chamfer 234a and the chamfer 234b of the conductive element 234 are substantially asymmetric with respect to the central axis that separates them. The chamfer 232a of the conductive element 232 is adjacent to the chamfer 234b of the conductive element 234. The chamfer 232b of the conductive element 232 is adjacent to, or faces, the chamfer 235a of the conductive element 235.

Figure 3C:
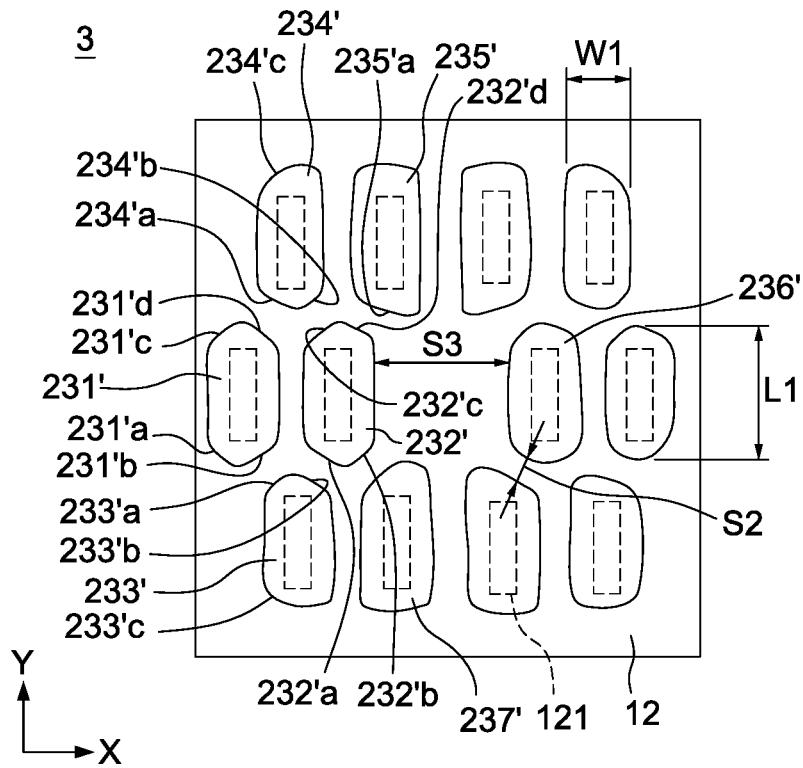
FIG. 3C illustrates a layout of conductive elements on a substrate according to some embodiments of the present disclosure.

FIG. 3C is a top view of conductive elements on a substrate 3 according to some embodiments of the present disclosure. The structure of the substrate 3 is similar to the structure of the substrate 1. The substrate 3 includes a dielectric layer 10, a protection layer 12, a protection layer 16, a patterned conductive layer 13, and a patterned conductive layer 15. The patterned conductive layer 13 includes the circuit layer 13' and conductive elements 231', 232', 233', 234', 235', 236', 237'. In some embodiments, the conductive elements may include at least one chamfer. In some embodiments, the conductive elements may be arranged in a pattern or layout similar to or the same as the layout as shown in the region 203 of FIG. 1. The conductive elements may be arranged in a pattern or layout similar to or the same as the layout as shown in the region 201 of FIG. 1. The conductive elements may be arranged in a pattern or layout similar to or the same as the layout as shown in the region 202 of FIG. 1.

The conductive elements 231', 232', 233', 234', 235', 236', 237' may have substantially the same length L1, width W1 and height. The conductive elements 231', 232', 233', 234', 235', 236', 237' may have substantially the same maximum length L1. The conductive elements 231', 232', 233', 234', 235', 236', 237' may have substantially the same maximum width W1. The conductive elements 231', 232', 233', 234', 235', 236', 237' may have substantially the same top surface area. The length L1 may be ranged from approximately 55 μm to approximately 75 μm. The width W1 may be ranged from approximately 15 μm to approximately 35 μm. An average distance S2 between any two adjacent, nearest-neighbor conductive elements may be ranged from approximately 25 μm to approximately 35 μm. An average pitch between any two adjacent, nearest-neighbor conductive elements may be ranged from approximately 25 μm to approximately 35 μm. A distance S3 between conductive elements 232', 236' may be ranged from approximately 50 μm to approximately 100 μm. In some embodiments, the length L1 may be equal to or less than the length L. The distance S2 may be equal to or less than the distance S. The distance S3 may be equal to or less than the distance S1.

The conductive element 231' has a central axis in the Y direction and a central axis in the X direction. The conductive element 231' includes a chamfer 231'a, a chamfer 231'b adjacent to the chamfer 231'a, a chamfer 231'c opposite to the chamfer 231'b, and a chamfer 231'd opposite to the chamfer 231'a. The chamfer 231'c is adjacent to the chamfer 231'd. The shape of the conductive element 231' may be an irregular hexagon. The shape of the conductive element 231' may be a polygon. The shape of the conductive element 231' may be an irregular polygon. The conductive element 232' has a central axis in the Y direction and a central axis in the X direction. The conductive element 232' includes a chamfer 232'a, a chamfer 232'b adjacent to the chamfer 232'a, a chamfer 232'c opposite to the chamfer 232'b, and a chamfer 232'd opposite to the chamfer 232'a. The chamfer 232'c is adjacent to the chamfer 232'd. The shape of the conductive element 232' may be an irregular hexagon. The shape of the conductive element 232' may be a polygon. The shape of the conductive element 232' may be an irregular polygon. The conductive element 233' has a central axis in the Y direction and a central axis in the X direction. The conductive element 233' includes a chamfer 233'a, a chamfer 233'b adjacent to the chamfer 233'a, and a chamfer 233'c opposite to the chamfer 233'b. The shape of the conductive element 233' may be an irregular hexagon. The shape of the conductive element 233' may be a polygon. The shape of the conductive element 233' may be an irregular polygon. The conductive element 234' has a central axis in the Y direction and a central axis in the X direction. The conductive element 234' includes a chamfer 234'a, a chamfer 234'b adjacent to the chamfer 234'a, and a chamfer 234'c opposite to the chamfer 234'b. The shape of the conductive element 234' may be an irregular hexagon. The shape of the conductive element 234' may be a polygon. The shape of the conductive element 234' may be an irregular polygon. The conductive element 235' has a central axis in the Y direction and a central axis in the X direction. The conductive element 235' includes a chamfer 235'd. The shape of the conductive element 235' may be an irregular pentagon. The shape of the conductive element 235' may be a polygon. The shape of the conductive element 235' may be an irregular polygon. In some embodiments, a chamfer may refer to a transitional edge or surface between two faces of a component (e.g. a photoresist island/block or a conductive element). In some embodiments, each of the conductive elements 231', 232', 233', 234', 235', 236', 237' may include 1, 3, or 4 chamfers.

The central axes of the conductive elements 231', 232', 233' in the Y direction are substantially parallel to one another and are misaligned from one another. The central axes of the conductive elements 231', 232' in the X direction are substantially co-linear. The central axis of the conductive element 233' in the X direction is substantially parallel to and misaligned from the central axes of the conductive elements 231', 232' in the X direction. The chamfer 231'a and the chamfer 231'b of the conductive element 231' are substantially asymmetric. The chamfer 231'a and the chamfer 231'b of the conductive element 231' are substantially asymmetric with respect to the central axis that separates them. The chamfer 231'c and the chamfer 231'd of the conductive element 231' are substantially asymmetric. The chamfer 231'c and the chamfer 231'd of the conductive element 231' are substantially asymmetric with respect to the central axis that separates them. The chamfer 232'a and the chamfer 232'b of the conductive element 232' are substantially asymmetric. The chamfer 232'a and the chamfer 232'b of the conductive element 232' are substantially asymmetric with respect to the central axis that separates them. The chamfer 232'c and the chamfer 232'd of the conductive element 232' are substantially asymmetric. The chamfer 232'c and the chamfer 232'd of the conductive element 232' are substantially asymmetric with respect to the central axis that separates them. The chamfer 233'a and the chamfer 233'b of the conductive element 233' are substantially asymmetric. The chamfer 233'a and the chamfer 233'b of the conductive element 233' are substantially asymmetric with respect to the central axis that separates them. The chamfer 233'a of the conductive element 233' is adjacent to, or faces, the chamfer 231'b of the conductive element 231'. The chamfer 233'b of the conductive element 233' is adjacent to, or faces, the chamfer 232'a of the conductive element 232'.

The central axes of the conductive elements 232', 234', 235' in the Y direction are substantially parallel to one another and are misaligned from one another in the Y direction. The central axes of the conductive elements 234', 235' in the X direction are substantially co-linear. The central axis of the conductive element 232' in the X direction is substantially parallel to and misaligned from the central axes of the conductive elements 234', 235' in the X direction. The chamfer 234'a and the chamfer 234'b of the conductive element 234' are substantially asymmetric. The chamfer 234'a and the chamfer 234'b of the conductive element 234' are substantially asymmetric with respect to the central axis that separates them. The chamfer 232'a of the conductive element 232' is adjacent to, or faces, the chamfer 234'b of the conductive element 234'. The chamfer 232'b of the conductive element 232' is adjacent to, or faces, the chamfer 235'a of the conductive element 235'.

Figure 3D:
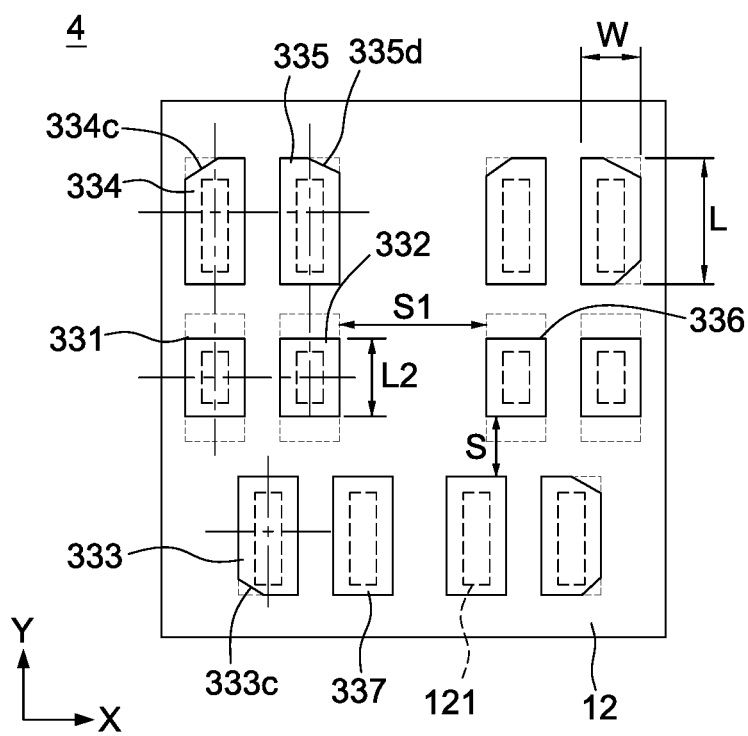
FIG. 3D illustrates a layout of conductive elements on a substrate according to some embodiments of the present disclosure.

FIG. 3D is a layout of conductive elements on a substrate 4 according to some embodiments of the present disclosure. The structure of the substrate 4 is similar to the structure of the substrate 1. The substrate 4 includes a dielectric layer 10, a protection layer 12, a protection layer 16, a patterned conductive layer 13, and a patterned conductive layer 15. The patterned conductive layer 13 includes a circuit layer 13' and conductive elements 331, 332, 333, 334, 335, 336, 337. In some embodiments, one or more of the conductive elements 331, 332, 333, 334, 335, 336, 337 may omit a chamfer. In some embodiments, the conductive elements 331, 332, 333, 334, 335, 336, 337 may be arranged in a pattern or layout similar to or the same as the layout as shown in the region 204 of FIG. 1.

The conductive elements 333, 334, 335, 337 may have substantially the same length L. The conductive elements 331, 332, 336 may have substantially the same length L2. The conductive elements 331, 332, 333, 334, 335, 336, 337 may have substantially the same width W and height. The conductive elements 333, 334, 335, 337 may have substantially the same maximum length L. The conductive elements 331, 332, 336 may have substantially the same maximum length L2. The conductive elements 331, 332, 333, 334, 335, 336, 337 may have substantially the same maximum width W. The conductive elements 333, 334, 335 may have substantially the same top surface area. The conductive elements 331, 332, 336 may have substantially the same top surface area. The length L may be ranged from approximately 55 μm to approximately 75 μm. The width W may be ranged from approximately 15 μm to approximately 35 μm. The length L2 may be ranged from approximately 45 μm to approximately 55 μm. An average distance S between any two adjacent, nearest-neighbor conductive elements may be ranged from approximately 25 μm to approximately 35 μm. An average pitch (not denoted in FIG. 3D) between any two adjacent, nearest-neighbor conductive elements may be ranged from approximately 25 μm to approximately 35 μm. A distance S1 between conductive elements 332, 336 may be ranged from approximately 50 μm to approximately 100 μm.

The conductive element 331 has a central axis in the Y direction and a central axis in the X direction. The conductive element 131 omits a chamfer. The shape of the conductive element 131 may be a rectangle. The shape of the conductive element 332 may be a polygon. The shape of the conductive element 332 may be a regular polygon. The conductive element 332 has a central axis in the Y direction and a central axis in the X direction. The shape of the conductive element 332 may be a rectangle. The shape of the conductive element 332 may be a polygon. The shape of the conductive element 332 may be a regular polygon. The conductive element 333 has a central axis in the Y direction and a central axis in the X direction. The conductive element 333 includes a chamfer 333c. The shape of the conductive element 333 may be an irregular pentagon. The shape of the conductive element 333 may be a polygon. The shape of the conductive element 333 may be an irregular polygon. The conductive element 334 has a central axis in the Y direction and a central axis in the X direction. The conductive element 334 includes a chamfer 334c. The shape of the conductive element 334 may be an irregular pentagon. The shape of the conductive element 334 may be a polygon. The shape of the conductive element 334 may be an irregular polygon. The conductive element 335 has a central axis in the Y direction and a central axis in the X direction. The shape of the conductive element 335 may be an irregular pentagon. The shape of the conductive element 335 may be a polygon. The shape of the conductive element 335 may be an irregular polygon. The conductive element 335 includes a chamfer 335d. In some embodiments, a chamfer may refer to a transitional edge or surface between two faces of a component (e.g. a photoresist island/block or a conductive element). In some embodiments, each of the conductive elements 331, 332, 333, 334, 335, 336, 337 may include 0, 1, or 2 chamfers.

The central axes of the conductive elements 331, 332, 333 in the Y direction are substantially parallel to one another and are misaligned from one another in the Y direction. The central axes of the conductive elements 331, 334 in the Y direction are substantially co-linear. The central axes of the conductive elements 332, 335 in the Y direction are substantially co-linear. The central axes of the conductive elements 334, 335 in the X direction are substantially co-linear. The central axes of the conductive elements 331, 332 in the X direction are substantially co-linear. The central axis of the conductive element 333 in the X direction is substantially parallel to and misaligned from the central axes of the conductive elements 331, 332 in the X direction.

Figure 4A:
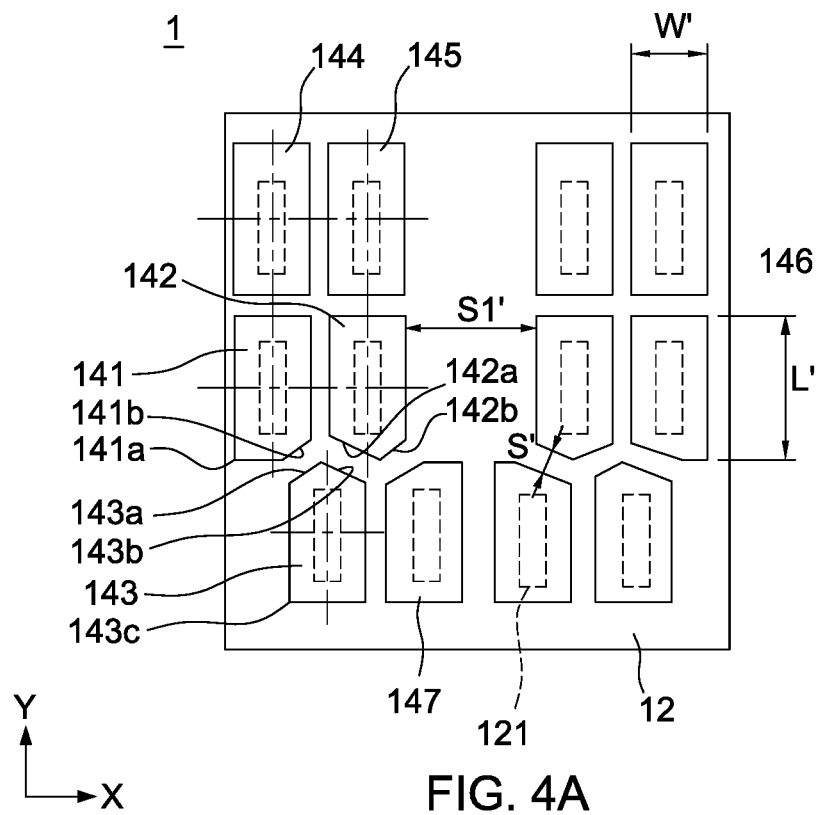
FIG. 4A illustrates a layout of a patterned photoresist layer on a substrate according to some embodiments of the present disclosure.

FIG. 4A is a layout of a patterned photoresist layer on the substrate 1 according to some embodiments of the present disclosure. Photoresist islands/blocks 141, 142, 143, 144, 145, 146, 147 are provided on the protection layer 12. Each of the photoresist islands/blocks 141, 142, 143, 144, 145, 146, 147 covers a conductive element. In some embodiments, the photoresist islands/blocks are used during lithography operations. The photoresist islands/blocks are used during etching operations. The photoresist islands/blocks may be used to form the conductive elements in the region 201 as shown in FIG. 1.

The photoresist islands/blocks 141, 142, 143, 144, 145, 146, 147 may have a substantially same length L' and a substantially same width W'. The photoresist islands/blocks 141, 142, 143, 144, 145, 146, 147 may have substantially the same maximum length L'. The photoresist islands/blocks 141, 142, 143, 144, 145, 146, 147 may have a substantially same maximum width W'. The length L' may be ranged from approximately 85 μm to approximately 95 μm. The width W' may be ranged from approximately 45 μm to approximately 55 μm. Thicknesses of the photoresist islands/blocks 141, 142, 143, 144, 145, 146, 147 may be ranged from approximately 15 μm to approximately 25 μm. An average distance S' between any two adjacent, nearest-neighbor photoresist islands/blocks may be ranged from approximately 7 μm to approximately 14 μm. An average pitch between any two adjacent, nearest-neighbor photoresist islands/blocks may be ranged from approximately 7 μm to approximately 14 μm. A distance S1' between the photoresist islands/blocks 142, 146 may be ranged from approximately 50 μm to approximately 100 μm.

The photoresist island/block 141 has a central axis in a Y direction and a central axis in an X direction. The photoresist island/block 141 has a corner 141a and a chamfer 141b adjacent to the corner 141a. The corner 141a has an angle of approximately 90 degrees. The photoresist island/block 142 has a central axis in the X direction and a central axis in the Y direction. The photoresist island/block 142 includes a chamfer 142a and a chamfer 142b adjacent to the chamfer 142a. The photoresist island/block 143 has a central axis in the X direction and a central axis in the Y direction. The photoresist island/block 143 includes a chamfer 143a and a chamfer 143b adjacent to the chamfer 143a. The photoresist island/block 144 has a central axis in the X direction and a central axis in the Y direction. The photoresist island/block 145 has a central axis in the X direction and a central axis in the Y direction.

The central axes of the photoresist islands/blocks 141, 142, 143 in the Y direction are substantially parallel to one another and are misaligned from one another in the Y direction. The central axes of the photoresist islands/blocks 141, 144 in the Y direction are substantially co-linear. The central axes of the photoresist islands/blocks 142, 145 in the Y direction are substantially co-linear. The central axes of the photoresist islands/blocks 144, 145 in the X direction are substantially co-linear. The central axes of the photoresist islands/blocks 141, 142 in the X direction are substantially co-linear. The central axis of the photoresist island/block 143 in the X direction is parallel to and misaligned from the central axes of the photoresist islands/blocks 141, 142 in the X direction. The chamfer 142a and the chamfer 142b of the photoresist island/block 142 are substantially asymmetric. The chamfer 142a and the chamfer 142b of the photoresist island/block 142 are substantially asymmetric with respect to the central axis that separates them. The chamfer 143a and the chamfer 143b of the photoresist island/block 143 are substantially asymmetric. The chamfer 143a and the chamfer 143b of the photoresist island/block 143 are substantially asymmetric with respect to the central axis that separates them. In some embodiments, a chamfer may refer to a transitional edge or surface between two faces of a component (e.g. a photoresist island/block or a conductive element).

Figure 4B:
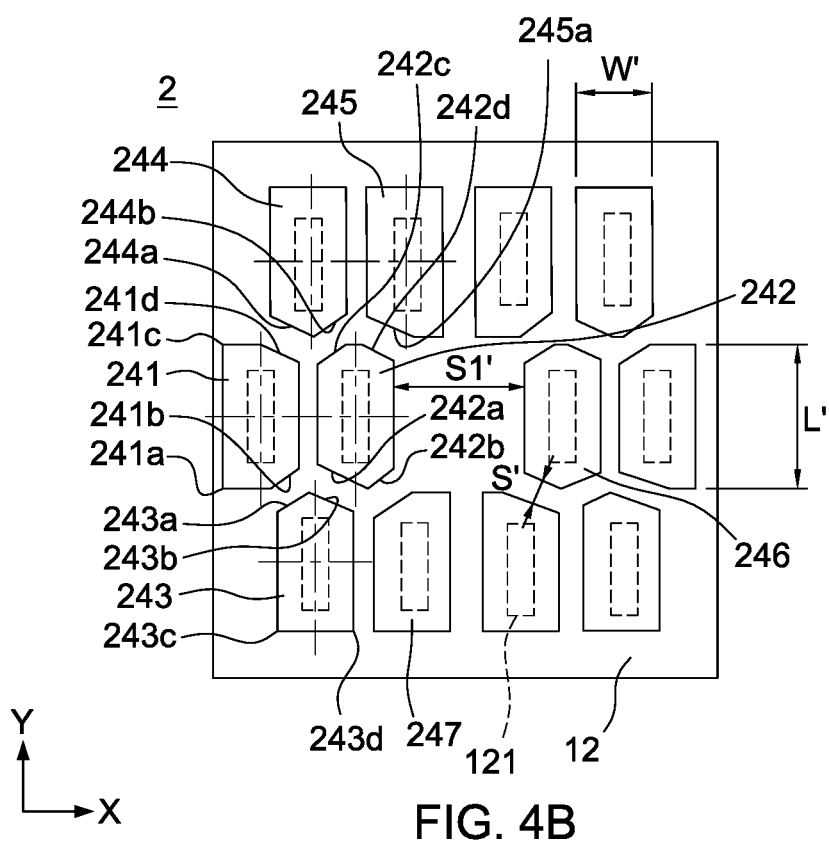
FIG. 4B illustrates a layout of a patterned photoresist layer on a substrate according to some embodiments of the present disclosure.

FIG. 4B is a layout of a patterned photoresist layer on the substrate 2 or the substrate 3 according to some embodiments of the present disclosure. Photoresist islands/blocks 241, 242, 243, 244, 245, 246, 247 are provided on the protection layer 12. Each of the photoresist islands/blocks 241, 242, 243, 244, 245, 246, 247 correspondingly covers a conductive element. In some embodiments, the photoresist islands/blocks are used during lithography operations. The photoresist islands/blocks are used during etching operations. The photoresist islands/blocks may be used in the region 202 or 203 as shown in FIG. 1.

The photoresist islands/blocks 241, 242, 243, 244, 245, 246, 247 may have substantially the same length L' and width W'. The photoresist islands/blocks 241, 242, 243, 244, 245, 246, 247 may have substantially the same maximum length L'. The photoresist islands/blocks 241, 242, 243, 244, 245, 246, 247 may have substantially the same maximum width W'. The length L' may be ranged from approximately 85 μm to approximately 95 μm. The width W' may be ranged from approximately 45 μm to approximately 55 μm. Thicknesses of the photoresist islands/blocks 241, 242, 243, 244, 245, 246, 247 may be ranged from approximately 15 μm to approximately 25 μm. An average distance S' between any two adjacent, nearest-neighbor photoresist islands/blocks may be ranged from approximately 7 μm to approximately 14 μm. An average pitch between any two adjacent, nearest-neighbor photoresist islands/blocks may be ranged from approximately 7 μm to approximately 14 μm. A distance S1' between the photoresist islands/blocks 242, 246 may be ranged from approximately 50 μm to approximately 100 μm.

The photoresist island/block 241 has a central axis in the Y direction and a central axis in the X direction. The photoresist island/block 241 has a corner 241a, a chamfer 241b adjacent to the corner 241a, a corner 241c, and a chamfer 241d adjacent to the corner 241c. The corner 241a or 241c has an angle of approximately 90 degrees. The photoresist island/block 242 has a central axis in the X direction and a central axis in the Y direction. The photoresist island/block 242 includes a chamfer 242a, a chamfer 242b adjacent to the chamfer 242a, a chamfer 242c opposite to the chamfer 242b, and a chamfer 242d opposite to the chamfer 242a. The photoresist island/block 243 has a central axis in the X direction and a central axis in the Y direction. The photoresist island/block 243 includes a chamfer 243a, a chamfer 243b adjacent to the chamfer 243a, a corner 243c, and a corner 243d adjacent to the corner 243c. The corner 243c or 243d has an angle of substantially 90 degrees. The photoresist island/block 244 has a central axis in the X direction and a central axis in the Y direction. The patterned photoresist 244 includes a chamfer 244a and a chamfer 244b adjacent to the chamfer 244a. The photoresist island/block 245 has a central axis in the X direction and a central axis in the Y direction. The patterned photoresist 245 includes a chamfer 245a. In some embodiments, a chamfer may refer to a transitional edge or surface between two faces of a component (e.g. a photoresist island/block or a conductive element).

The central axes of the photoresist islands/blocks 241, 242, 243 in the Y direction are substantially parallel to one another and are misaligned from one another in the Y direction. The central axes of the photoresist islands/blocks 241, 242 in the X direction are substantially co-linear. The central axis of the photoresist island/block 243 in the X direction is parallel to and misaligned from the central axes of the photoresist islands/blocks 241, 242 in the X direction. The chamfer 242a and the chamfer 242b of the photoresist island/block 242 are substantially asymmetric. The chamfer 242a and the chamfer 242b of the photoresist island/block 242 are substantially asymmetric with respect to the central axis that separates them. The chamfer 243a and the chamfer 243b of the photoresist island/block 243 are substantially asymmetric. The chamfer 243a and the chamfer 243b of the photoresist island/block 243 are substantially asymmetric with respect to the central axis that separates them. The chamfer 241b of the photoresist island/block 241 is adjacent to the chamfer 243a of the photoresist island/block 243. The chamfer 242a of the photoresist island/block 242 is adjacent to the chamfer 243b of the photoresist island/block 243.

The central axes of the photoresist islands/blocks 242, 244, 245 in the Y direction are substantially parallel to one another and are misaligned from one another. The central axes of the photoresist islands/blocks 244, 245 in the X direction are substantially co-linear. The central axis of the photoresist island/block 242 in the X direction is parallel to and misaligned from the central axes of the photoresist islands/blocks 244, 245 in the X direction. The chamfer 244a and the chamfer 244b of the photoresist island/block 244 are substantially asymmetric. The chamfer 244a and the chamfer 244b of the photoresist island/block 244 are substantially asymmetric with respect to the central axis that separates them. The chamfer 244b of the photoresist island/block 244 is adjacent to the chamfer 242a of the photoresist island/block 242. The chamfer 245a of the photoresist island/block 245 is adjacent to the chamfer 242b of the photoresist island/block 242.

This arrangement of the photoresist islands/blocks 241, 242, 243, 244, 245 can provide for a flexible space for the arrangement/formation of the corresponding conductive elements.

Figure 4C:
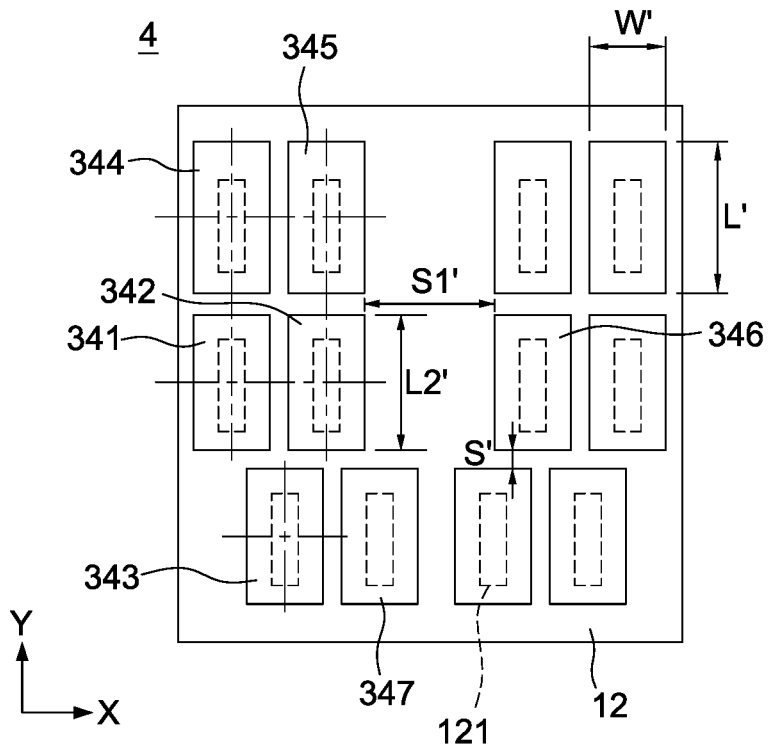
FIG. 4C illustrates a layout of a patterned photoresist layer on a substrate according to some embodiments of the present disclosure.

FIG. 4C is a layout of a patterned photoresist layer on the substrate 4 according to some embodiments of the present disclosure. Photoresist islands/blocks 341, 342, 343, 344, 345, 346, 347 are provided on the protection layer 12. Each of the photoresist islands/blocks 341, 342, 343, 344, 345, 346, 347 correspondingly covers a conductive element. Each of the photoresist islands/blocks 341, 342, 343, 344, 345, 346, 347 omits a chamfer (e.g. has no chamfer). In some embodiments, the photoresist islands/blocks are used during lithography operations. The photoresist islands/blocks are used during etching operations. The photoresist islands/blocks may be used in the region 204 as shown in FIG. 1.

The photoresist islands/blocks 343, 344, 345, 347 may have substantially the same length L' and width W'. The photoresist islands/blocks 341, 342, 346 may have substantially the same length L2' and width W'. The photoresist islands/blocks 343, 344, 345, 347 may have substantially the same maximum length L'. The photoresist islands/blocks 341, 342, 346 may have substantially the same maximum length L2'. The photoresist islands/blocks 341, 342, 343, 344, 345, 346, 347 may have substantially the same maximum width W'. The length L' may be ranged from approximately 85 μm to approximately 95 μm. The length L2' may be ranged from approximately 65 μm to approximately 75 μm. The width W' may be ranged from approximately 45 μm to approximately 55 μm. Thicknesses of the photoresist islands/blocks 341, 342, 343, 344, 345, 346, 347 may be ranged from approximately 15 μm to approximately 25 μm. An average distance S' between any two adjacent, nearest-neighbor photoresist islands/blocks may be ranged from approximately 7 μm to approximately 14 μm. An average pitch between any two adjacent, nearest-neighbor photoresist islands/blocks may be ranged from approximately 7 μm to approximately 14 μm. A distance S1' between the photoresist islands/blocks 342, 346 may be ranged from approximately 50 μm to approximately 100 μm.

The photoresist island/block 341 has a central axis in the Y direction and a central axis in the X direction. The photoresist island/block 342 has a central axis in the X direction and a central axis in the Y direction. The photoresist island/block 343 has a central axis in the X direction and a central axis in the Y direction. The photoresist island/block 344 has a central axis in the X direction and a central axis in the Y direction. The photoresist island/block 345 has a central axis in the X direction and a central axis in the Y direction.

The central axes of the photoresist islands/blocks 341, 342, 343 in the Y direction are substantially parallel to one another and are misaligned from one another in the Y direction. The central axes of the photoresist islands/blocks 341, 344 in the Y direction are substantially co-linear. The central axes of the photoresist islands/blocks 342, 345 in the Y direction are substantially co-linear. The central axes of the photoresist islands/blocks 344, 345 in the X direction are substantially co-linear. The central axes of the photoresist islands/blocks 341, 342 in the X direction are substantially co-linear. The central axis of the photoresist island/block 343 in the X direction is parallel to and misaligned from the central axes of the photoresist islands/blocks 341, 342 in the X direction.

FIG. 5A through FIG. 5F illustrate some embodiments of a method of manufacturing the semiconductor device package 1' or the substrate 1 according to some embodiments of the present disclosure.

Figure 5A:
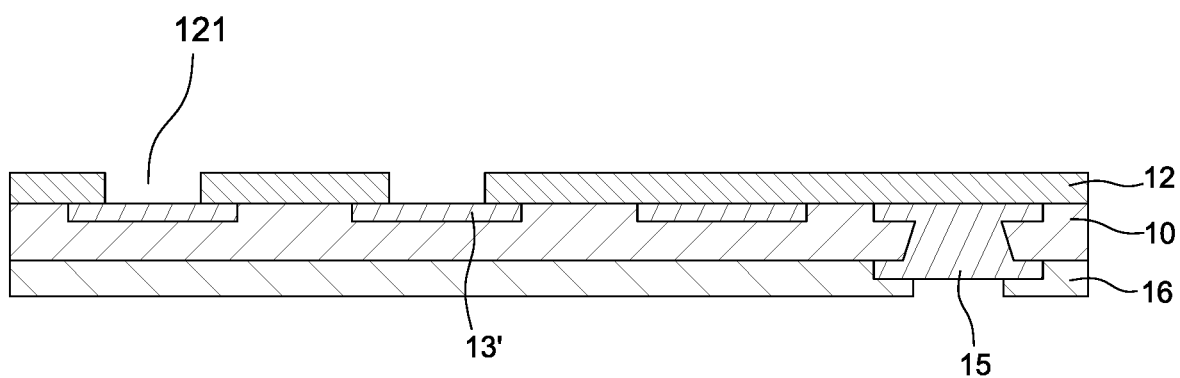
FIG. 5A illustrates a method of manufacturing a substrate according to some embodiments of the present disclosure.

Referring to FIG. 5A, a method for manufacturing the semiconductor device package 1' or the substrate 1 includes providing a dielectric layer 10 with protection layers 12, 16, a circuit layer 13', and a patterned conductive layer 15. A seed layer may be formed on the carrier 10, and the circuit layer 13' may be formed on the seed layer. The circuit layer 13' is electrically connected to the patterned conductive layer 15 via an interconnection element. The circuit layer 13' is partially exposed by openings 121 defined by the protection layer 12.

Figure 5B:
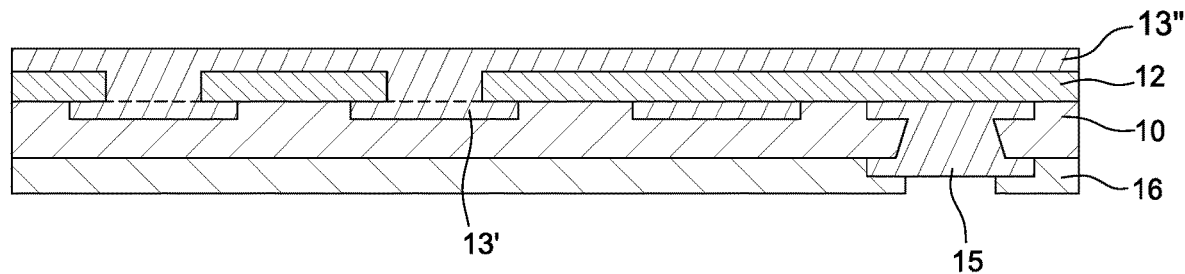
FIG. 5B illustrates a method of manufacturing a substrate according to some embodiments of the present disclosure.

Referring to FIG. 5B, a conductive layer 13" is formed on the protection layer 12 and the circuit layer 13'. The conductive layer 13" is panel-plated over the protection layer 12 and the circuit layer 13'. Since the conductive layer 13" is formed by a panel plating operation, the conductive layer 13" can have a uniform thickness. A seed layer may be formed on the protection layer 12 and the circuit layer 13' prior to the formation of the conductive layer 13".

Figure 5C:
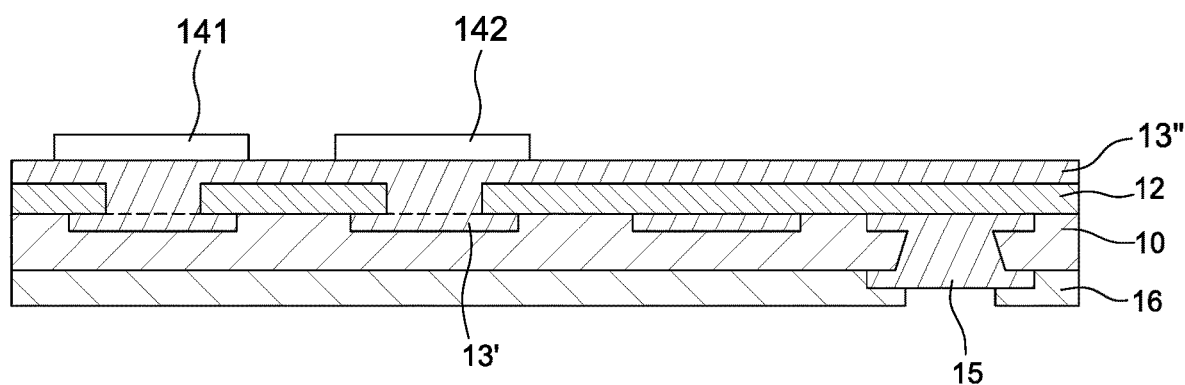
FIG. 5C illustrates a method of manufacturing a substrate according to some embodiments of the present disclosure.

Referring to FIG. 5C, photoresist islands/blocks 141, 142 are provided on the conductive layer 13". In some embodiments, one or more of the photoresist islands/blocks 141, 142 have a chamfer design. The photoresist island/block 141 or 142 may include at least have one chamfer. In other embodiments, the photoresist islands/blocks 141, 142 may have no chamfer design. The shape of the photoresist island/block 141 or 142 may be a polygon. The shape of the photoresist island/block 141 or 142 may be an irregular polygon. The photoresist island/block 141 or 142 may have multiple transitional edges (e.g. two, three, four, five, six, seven, eight, or more transitional edges).

Figure 5D:
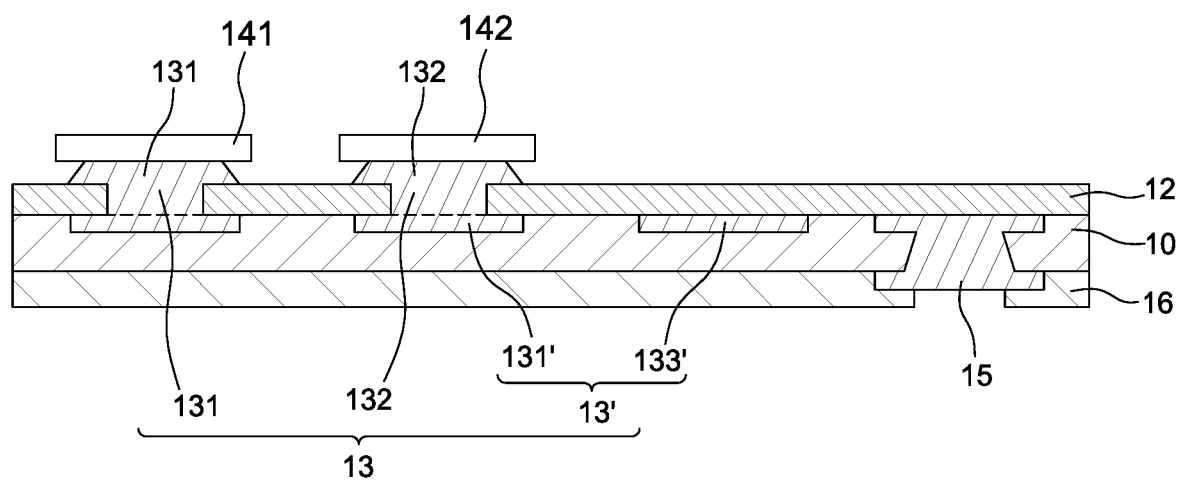
FIG. 5D illustrates a method of manufacturing a substrate according to some embodiments of the present disclosure.

Referring to FIG. 5D, the conductive layer 13" is etched to form the conductive elements 131, 132 by etching operations. During the etching operations, the conductive layer 13" is etched by an etching solution from top to bottom so as to form the conductive elements 131, 132. The shapes of the conductive elements 131, 132 can be affected by the shapes of the photoresist islands/blocks 141, 142. The shape of the conductive element 131 or 132 may be a polygon. The shape of the conductive element 131 or 132 may be an irregular polygon. The conductive element 131 or 132 may have multiple transitional edges (e.g. two three, four, five, six, seven, eight, or more transitional edges). The circuit layer 13' includes the conductive pad 131' and the conductive trace 133' adjacent to the conductive pad 131'. The conductive element 131/132 may be disposed on the conductive pad 131' or the conductive trace 133'. Each of the conductive elements 131, 132 has a first portion embedded in the protection layer 12 and a second portion protruding from the protection layer 12. The second portion of the conductive element 131/132 tapers from the bottom of the second portion toward the top of the second portion due to an over-etching effect. The conductive elements 131, 132 have substantially a same top surface area A. The conductive elements 131, 132 have substantially a same height. A length or a width of one of the conductive elements 131, 132 is less than a length or a width of one of the photoresist islands/blocks 141, 142 by approximately 20 μm to approximately 30 μm.

Referring back to FIG. 4A, the chamfer 142b of the photoresist island/block 142 is separated from the chamfer 143b of the photoresist island/block 143 by the distance S' and the right side of the photoresist island/block 142 is separated from the left side of the photoresist island/block 146 by the distance S1'. There is no photoresist island/block adjacent to the left side of the photoresist island/block 143 and the right side of the photoresist island/block 143 is separated from the left side of the photoresist island/block 147 by the distance S'. According to the design of the photoresist islands/blocks, each photoresist island/block has substantially the same length L'. Since there is sufficient space for the photoresist islands/blocks 141, 142, 146, the photoresist islands/blocks 141, 142, 146 with the length L' may have a desirable etching compensation value for the conductive elements.

Referring back to FIG. 3A, the conductive elements shown in FIG. 3A are correspondingly formed by applying the photoresist islands/blocks shown in FIG. 4A during the lithography operations/etching operations. During the etching operations, the etching rate on the chamfer 132a of the conductive element 132 would be relative slow. The etching rate on the right side of the conductive element 132 would be relative fast. The chamfer 132a of the conductive element 132 may be over-etched by approximately 5 μm to approximately 13 μm. The right side of the conductive element 132 may be over-etched by approximately 7 μm to approximately 15 μm. The etching rate on the left side of the conductive element 133 would be relative fast. The etching rate on the right side of the conductive element 133 would be relative slow. The left side of the conductive element 133 may be over-etched by approximately 7 μm to approximately 15 μm. The right side of the conductive element 133 may be over-etched by approximately 5 μm to approximately 13 μm.

According to the design of the photoresist islands/blocks shown in FIG. 4A, the conductive elements shown in FIG. 3A could have substantially the same length L which satisfies some design specifications. Accordingly, even though the shapes of the conductive elements shown in FIG. 3A may be not a rectangle, it would not affect the electrical connection between the conductive elements and a semiconductor device (e.g. the semiconductor device 19). The design of the photoresist islands/blocks shown in FIG. 4A may save the space on the substrate 1.

Referring back to FIG. 4B, the chamfer 242a of the photoresist island/block 242 is separated from the chamfer 243b of the photoresist island/block 241 by the distance S' and the right side of the photoresist island/block 242 is separated from the left side of the photoresist island/block 246 by the distance S1'. There is no photoresist island/block adjacent to the left side of the photoresist island/block 243 and the right side of the photoresist island/block 243 is separated from the left side of the photoresist island/block 247 by the distance S'. According to the design of the photoresist islands/blocks, each photoresist island/block has substantially the same length L'. Since there is sufficient space for the densely-arranged photoresist islands/blocks 241, 242, 246, the photoresist islands/blocks 241, 242, 246 with the length L' may have a desirable etching compensation value for the conductive elements.

Referring back to FIG. 3B, the conductive elements shown in FIG. 3B are correspondingly formed by applying the photoresist islands/blocks shown in FIG. 4B during the lithography operations/etching operations. During the etching operations, the etching rate on the chamfer 232a of the conductive element 232 would be relative slow. The etching rate on the right side of the conductive element 232 would be relative fast. The chamfer 232a of the conductive element 232 may be over-etched by approximately 5 μm to approximately 13 μm. The right side of the conductive element 232 may be over-etched by approximately 7 μm to approximately 15 μm. The etching rate on the left side of the conductive element 233 would be relative fast. The etching rate on the right side of the conductive element 233 would be relative slow. The left side of the conductive element 233 may be over-etched by approximately 7 μm to approximately 15 μm. The right side of the conductive element 233 may be over-etched by approximately 5 μm to approximately 13 μm.

According to the design of the photoresist islands/blocks shown in FIG. 4B, the conductive elements shown in FIG. 3B could have substantially the same length L which satisfies with a desired value. Accordingly, even though the shapes of the conductive elements shown in FIG. 3B may be not a rectangle, it would not affect the electrical connection between the conductive elements and a semiconductor device (e.g. the semiconductor device 19). Compared with the photoresist islands/blocks shown in FIG. 4A, the design of the photoresist islands/blocks shown in FIG. 4B may further save the space on the substrate 2.

In some embodiments, the photoresist islands/blocks shown in FIG. 4B may correspond to the conductive elements shown in FIG. 3C. The arrangement of the conductive elements shown in FIG. 3C are similar to the arrangement of the conductive elements shown in FIG. 3B. The shapes of the conductive elements shown in FIG. 3C may be affected by a timing control of the etching operations.

Referring back to FIG. 4C, the lower side of the photoresist island/block 342 is separated from the upper side of the photoresist island/block 343 or 347 by the distance S' and the right side of the photoresist island/block 342 is separated from the left side of the photoresist island/block 346 by the distance S1'. There is no photoresist island/block adjacent to the left side of the photoresist island/block 343 and the right side of the photoresist island/block 343 is separated from the left side of the photoresist island/block 347 by the distance S'.

According to the design of the photoresist islands/blocks, the photoresist islands/blocks 341, 342, 346 have substantially the same length L2'. The photoresist islands/blocks 343, 344, 345, 347 have substantially the same length L'. The length L2' is less than the length L'. The arrangement of the photoresist islands/blocks results in the insufficient length L2'. Since there is a small amount of space for the photoresist islands/blocks 341, 342, 346, the photoresist islands/blocks 341, 342, 346 with the length L2' may not have an etching compensation value suitable for the conductive elements.

Referring back to FIG. 3D, the conductive elements shown in FIG. 3D are correspondingly formed by applying the photoresist islands/blocks shown in FIG. 4C during the lithography operations/etching operations. During the etching operations, the etching rate on the lower side of the conductive element 332 would be relative slow. The etching rate on the right side of the conductive element 332 would be relative fast. The lower side of the conductive element 332 may be over-etched by approximately 5 μm to approximately 13 μm. The right side of the conductive element 332 may be over-etched by approximately 7 μm to approximately 15 μm. The etching rate on the left side of the conductive element 333 would be relative fast. The etching rate on the right side of the conductive element 333 would be relative slow. The left side of the conductive element 333 may be over-etched by approximately 7 μm to approximately 15 μm. The right side of the conductive element 333 may be over-etched by approximately 5 μm to approximately 13 μm.

According to the design of the photoresist islands/blocks shown in FIG. 4C, the conductive elements 331, 332, 336 shown in FIG. 3D may have the insufficient length L2 which does not satisfy with a desired value. Accordingly, the electrical connection between the conductive elements 331, 332, 336 and a semiconductor device (e.g. the semiconductor device 19) may fail. Compared with the photoresist islands/blocks shown in FIG. 4A, the design of the photoresist islands/blocks shown in FIG. 4C may occupy more space on the substrate 4.

Figure 5E:
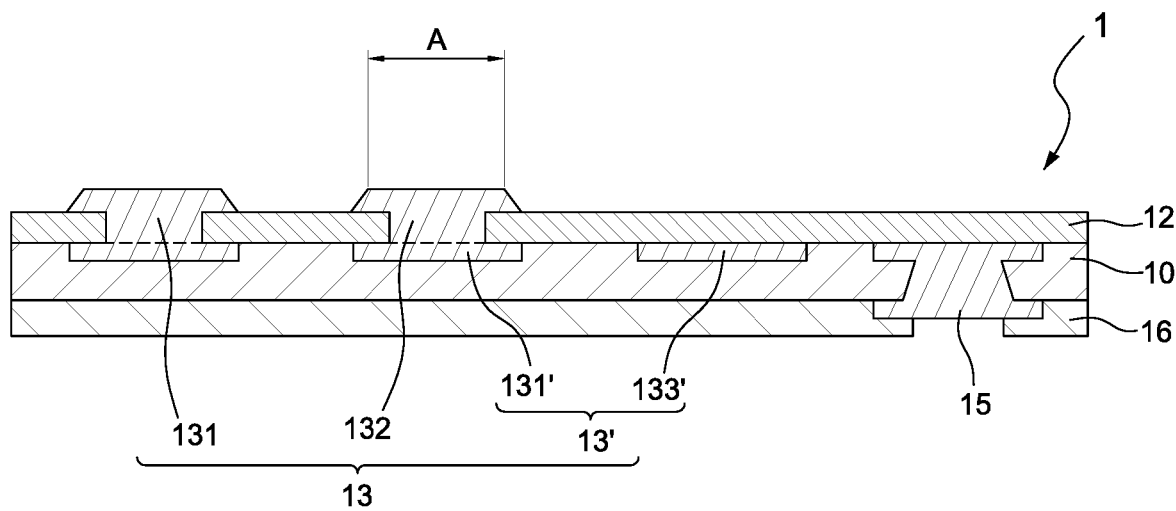
FIG. 5E illustrates a method of manufacturing a substrate according to some embodiments of the present disclosure.

Referring to FIG. 5E, the photoresist islands/blocks 141, 142 are removed. After removing the photoresist islands/blocks 141, 142, the substrate 1 is formed. The patterned conductive layer 13 includes the circuit layer 13', the conductive element 131, and the conductive element 132. The conductive element 131 may be disposed on the conductive pad 131' or the conductive trace 133'.

Figure 5F:
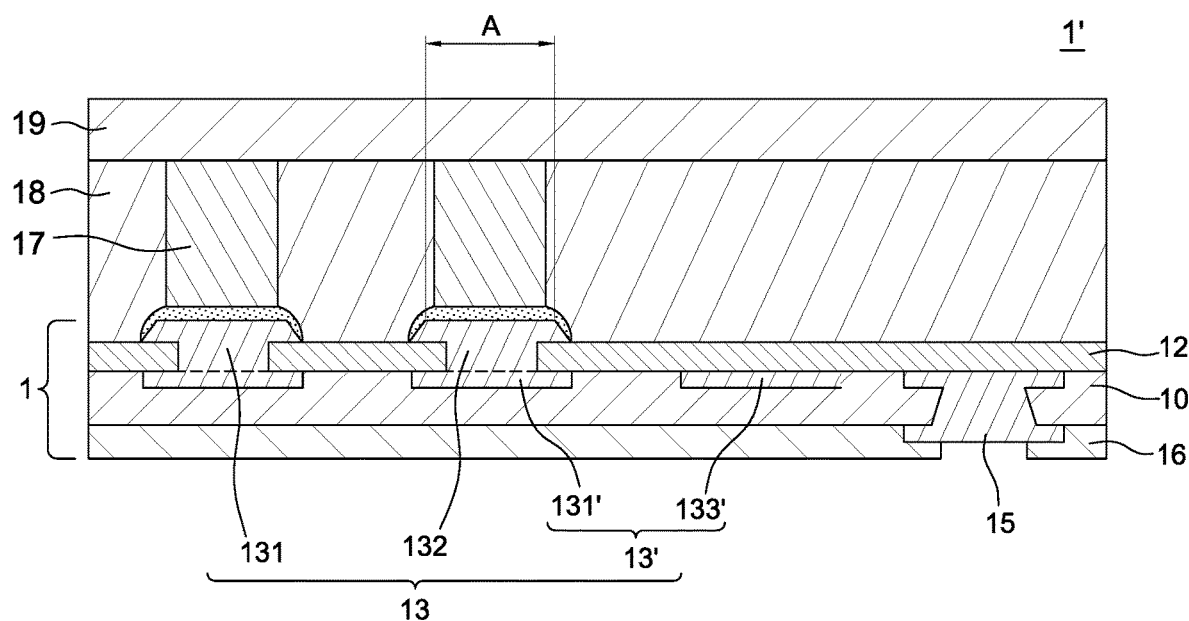
FIG. 5F illustrates a method of manufacturing a substrate according to some embodiments of the present disclosure.

Referring to FIG. 5F, the semiconductor device 19 is attached to the conductive elements 131, 132 through solder and a conductive post 17. An encapsulant 18 is filled between the semiconductor device 19 and the protection layer 12. The semiconductor device package 1' is formed after conducting one or more singulation operations.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a first numerical value can be deemed to be substantially, approximately, or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially co-linear" can refer to two axes within micrometers of lying along a same line or plane, such as within 5 μm, within 4 μm, within 3 μm, within 2 μm, or within 1 μm of lying along the same line or plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate for packaging a semiconductor device, comprising:
    a dielectric layer having an upper surface;
    a first conductive element disposed on the upper surface of the dielectric layer, the first conductive element having a first central axis in a first direction and a second central axis in a second direction, the first conductive element comprising a first chamfer and a second chamfer adjacent to the first chamfer;
    a second conductive element disposed on the upper surface of the dielectric layer, the second conductive element having a first central axis in the first direction and a second central axis in the second direction; and
    a third conductive element disposed on the upper surface of the dielectric layer, the third conductive element having a first central axis in the first direction and a second central axis in the second direction,
        wherein, the first central axes of the first, second, and third conductive elements are substantially parallel to one another and are misaligned from one another in the first direction, wherein the second central axes of the first and second conductive elements are substantially co-linear in the second direction, the second central axis of the third conductive element is substantially parallel to and misaligned from the second central axes of the first and second conductive elements, and wherein the first chamfer and the second chamfer are substantially asymmetric, and
        wherein the third conductive element overlaps with the first and second conductive elements in one of the first and second directions.

2. The substrate of claim 1, wherein the first conductive element further comprises a third chamfer.

3. The substrate of claim 2, wherein the first conductive element further comprises a fourth chamfer.

4. The substrate of claim 1, wherein the first, second, and third conductive elements have substantially a same top surface area.

5. The substrate of claim 1, further comprising a circuit layer comprising a conductive pad and a conductive trace adjacent to the conductive pad, and wherein the first conductive element is disposed on the conductive pad or the conductive trace.

6. The substrate of claim 5, further comprising a protection layer disposed on the dielectric layer, and wherein the first conductive element comprises a first portion embedded in the protection layer and a second portion protruding from the protection layer.

7. The substrate of claim 6, wherein a width of a bottom surface of the second portion is greater than a width of a top surface of the second portion.

8. The substrate of claim 7, wherein the second portion tapers from the bottom surface of the second portion toward the top surface of the second portion.

9. The substrate of claim 6, wherein a width of a bottom surface of the second portion is greater than a width of the first portion.

10. The substrate of claim 1, wherein the first, second, and third conductive elements have substantially a same maximum length.

11. The substrate of claim 10, wherein the first, second, and third conductive elements have substantially a same maximum width.

12. The substrate of claim 1, wherein the first, second, and third conductive elements have substantially a same height.

13. A substrate for packaging a semiconductor device, comprising:
    a dielectric layer having an upper surface; and
    a first conductive element disposed on the upper surface of the dielectric layer, the first conductive element having a first central axis in a first direction and a second central axis in a second direction, the first conductive element comprising a first chamfer and a second chamfer adjacent to the first chamfer;
    a second conductive element disposed on the upper surface of the dielectric layer, the second conductive element having a first central axis in the first direction and a second central axis in the second direction, the second conductive element comprising a first chamfer; and
    a third conductive element disposed on the upper surface of the dielectric layer, the third conductive element having a first central axis in the first direction and a second central axis in the second direction, the third conductive element comprising a first chamfer,
    wherein the first chamfer of the first conductive element is adjacent to the first chamfer of the second conductive element and the second chamfer of the first conductive element is adjacent to the first chamfer of the third conductive element.

14. The substrate of claim 13, wherein the first chamfer and the second chamfer of the first conductive element are substantially asymmetric.

15. The substrate of claim 13, wherein the first conductive element further comprises a third chamfer.

16. The substrate of claim 13, wherein a distance between the first chamfer of the first conductive element and the first chamfer of the third conductive element is ranged from approximately 25 micrometers (μm) to approximately 35 μm.

17. The substrate of claim 13, wherein the third conductive element further comprises a second chamfer adjacent to the first chamfer of the third conductive element, and the first chamfer and the second chamfer of the third conductive element are substantially asymmetric.

18. The substrate of claim 17, wherein the third conductive element further comprises a third chamfer and a fourth chamfer adjacent to the third chamfer of the third conductive element, the third chamfer and the fourth chamfer of the third conductive element are substantially asymmetric.

19. The substrate of claim 13, wherein the second conductive element further comprises a second chamfer adjacent to the first chamfer of the second conductive element and the first chamfer and the second chamfer of the second conductive element are substantially asymmetric.

20. The substrate of claim 19, wherein the second conductive element further comprises a third chamfer and a fourth chamfer adjacent to the third chamfer of the second conductive element, the third chamfer and the fourth chamfer of the second conductive element are substantially asymmetric.

21. The substrate of claim 13, wherein the first, second, and third conductive elements have substantially a same top surface area.

22. The substrate of claim 13, wherein the first chamfer of the first conductive element and the first chamfer of the second conductive element are face-to-face.

23. The substrate of claim 1, wherein the first, second, or third conductive elements are exposed from the upper surface of the dielectric layer.

24. The substrate of claim 1, wherein the first and second directions are substantially orthogonal to each other.

25. The substrate of claim 24, wherein the first and second directions pass through a center of the first, second, or third conductive element.

* * * * *